United States Patent [19]

Gillingham et al.

[11] Patent Number: 4,803,705
[45] Date of Patent: Feb. 7, 1989

[54] ANALOG PHASE LOCKED LOOP

[75] Inventors: Peter Gillingham, Ottawa; Jan H. Erkku, Nepean, both of Canada

[73] Assignee: Mitel Corporation, Ontario, Canada

[21] Appl. No.: 87,049

[22] Filed: Aug. 19, 1987

[30] Foreign Application Priority Data

Aug. 29, 1986 [CA] Canada .................................. 517,262

[51] Int. Cl.$^4$ ............................................. H03D 3/24
[52] U.S. Cl. ..................................... 375/120; 375/111; 370/100; 331/1 A
[58] Field of Search ............... 375/111, 118, 119, 120; 371/41, 46, 47; 370/100; 328/133, 135; 331/1 A, DIG. 2, 25, 177 R

[56] References Cited

U.S. PATENT DOCUMENTS

| | | | |
|---|---|---|---|
| 3,878,334 | 4/1975 | Halpern | 375/118 |
| 4,110,557 | 8/1978 | Huber | 375/120 |
| 4,242,639 | 12/1980 | Boone | 375/120 X |
| 4,574,243 | 3/1986 | Levine | 375/120 X |

FOREIGN PATENT DOCUMENTS

| | | | |
|---|---|---|---|
| 10158219 | 10/1985 | European Pat. Off. | |
| 2127243 | 4/1984 | United Kingdom | 375/119 |
| 2157904 | 10/1985 | United Kingdom | |

Primary Examiner—A. D. Pellinen
Assistant Examiner—Derek S. Jennings
Attorney, Agent, or Firm—Laff, Whitesel, Conte & Saret

[57] ABSTRACT

A phase locked loop for synchronizing a local digital signal with an incoming data signal is described. Parallel phase and frequency detectors compare the local and incoming signals and generate control pulse signals for controlling the frequency of a voltage controlled oscillator which generates the local digital signal. Logic circuitry is included in both the phase and frequency detectors for adjusting the generated control pulse signals in the event of detection of elongated pulse widths of the incoming data signal, indicating one of either an absence of incoming data signal or a bipolar violation in the event the data signals are ASI encoded. The phase locked loop is characterized by quick pull-in time, large pull-in frequency range, accurate clocking and low cost.

14 Claims, 4 Drawing Sheets

ANALOG PHASE LOCKED LOOP

FIELD OF THE INVENTION

This invention relates to digital communication systems, and in particular to a phase locked loop for synchronizing a local digital signal with a remote received digital signal.

Modern day digital communication systems have been implemented for establishing integrated service digital networks (ISDN) compatible with telephone systems. Phase locked loops are normally utilized within ISDN systems for synchronizing a local telephone/computer terminal with a remote incoming digital signal for providing digital voice and data communication between the local terminal and a remote central office or private branch exchange (PBX), as described in detail below.

A well known and useful ISDN communication standard has been defined in CCITT Draft Recommendation I.430, Layer 1, and is described in a publication by the European Computer Manufacturer's Association, Standard ECMA Ph Lx1, entitled "Physical Layer for the $S_o$ Interface Between Data Processing Equipment and Private Circuit Switching Network".

According to the CCITT ISDN standard, digital communication is established through telephone lines in serial format and various encoding schemes, such as differential biphase, alternate mark inversion (AMI), or alternate space inversion (ASI), are used for conveying digital signals. According to the pseudo-ternary alternate space inversion (ASI) encoding scheme, binary ones are represented by the absence of line signal and binary zeros are represented alternately by positive and negative signal pulses on the telephone line.

In order for a local telephone/computer terminal to communicate with a remote source such as a central office or PBX, the terminal must be able to receive and extract binary information from the encoded signals carried by the telephone line. The first step in this process is known as clock extraction, a process by which a local clock signal is generated and synchronized to the incoming data stream. A bit alignment process then performs the necessary differentiation of the bits from one another in the data stream, as well as providing a clock signal source for the remainder of the terminal circuitry and a correct frequency reference so that digitized voice data may be decoded and reproduced in its original form.

The circuit which is typically used to perform clock extraction is known as a phase locked loop (PLL). The purpose of a PLL is to synchronize the frequency and phase of a local oscillator to a reference input signal. Once the signals are synchronized, the phase locked loop works to keep the phase error between the local and reference signals at zero, or at least very small.

There are three identifiable functional units in any phase locked loop: a voltage controlled (or alternatively current controlled) oscillator, a loop filter, and a phase detector. The voltage controlled oscillator (VCO) provides a local frequency source for the circuit. The phase detector (PD) compares the output signal from the VCO to the input reference signal, and produces a DC output signal proportional to the phase difference between the two signals. The PD output is passed through a low pass filter to produce an average error signal, which is in turn used to control the VCO frequency.

The initial acquisition phase of a PLL used for timing recovery presents a significant practical problem. Narrow loop bandwidth specifications are generally required for digital jitter supression, which in turn restricts the "pull-in" range of the PLL, usually to within a few percent of the nominal VCO frequency. This is clearly inadequate in the event a non-accurate local frequency signal source such as a crystal oscillator is not used, since the loop must be able to obtain lock even when the input frequency deviates from the VCO free running frequency by as much as 50%. For a completely integrated, monolithic system, variation in frequency determining components of this order are usually tolerated.

DESCRIPTION OF THE RELATED ART

There are several prior art methods that are commonly used to effect acquisition, either alone or employed simultaneously.

A first prior art method is to use highly accurate initial VCO sources, such as crystal oscillators. The use of external crystal oscillators has been found to be expensive, and the crystals and associated circuitry typically consume a large amount of circuit board area and power.

Further prior art methods have been used such as sweeping the VCO frequency, or switching the loop filter once an inlock condition is obtained. Both of these methods are cumbersome, requiring special circuits to sweep the frequency or detect the inlock condition, respectively. In both cases, in the event lock is lost, the circuit must be able to first recognize the loss of lock condition, and secondly to switch back to its initial aquisition state to reobtain lock. This leads to very complicated circuitry and undesirable behaviour when lock is lost.

An additional approach has been suggested which utilizes a combined phase/frequency detector. Such an approached is described, for instance, in a textbook by Roland E. Best, entitled "Phase Locked Loops", McGraw-Hill, 1984. The combined phase/frequency detector proposed by Best is an elegant solution that provides a theoretically infinite frequency capture range, but suffers from a major drawback in that it requires a constant reference signal input, such as a continuous train of pulses. Any missing transitions or pulses in the reference signal input causes the detector of Best to erroneously give a large correction signal which causes the VCO output frequency to be overadjusted resulting in loss of lock. Thus, for an application wherein the reference signal is an incoming data bit stream, it is inevitable that there will be missing transitions, since the bit stream is data dependent. Accordingly, the prior art phase/frequency detector of Best is unsuitable for locking onto data dependent reference signals.

A further prior art method involves combining separate phase and frequency detectors in parallel. Circuitry is provided for disabling one of the separate phase and frequency detectors when the other is generating control signals to the VCO, in order that the two detectors do not operate simultaneously thereby destabilizing each other. Specifically, the frequency detector must provide a control signal when the input and reference signals differ in frequency, yet must not produce any output when the loop is in lock. Similarly, the phase detector must produce a net zero output when the inputs are not matched in frequency, yet must provide the correct "pull-in" control signal once the frequency detector has matched the two frequences.

The parallel phase and frequency detector method is suggested in FIG. 1 of an article by David G. Messerschmitt, entitled "Frequency Detectors for PLL Acquisition in Timing and Carrier Recovery", IEEE Transactions on Communications, Vol. COM-27, No. 9, September 1979, pp. 288–295.

According to the recommended I.430 ASI encoding scheme, the start of each frame of data is indicated by a bipolar violation comprised of a pair of adjacent plus and minus framing pulses followed by the first zero (space) bit having identical polarity as the minus framing pulse bit. The ASI input stream is typically received from the telephone line and converted to NRZ format such that in the event of a bipolar violation in which the first zero bit is adjacent to the framing pulse, an elongated NRZ zero bit is generated having a pulse width equal to approximately twice the nominal bit pulse width. Consequently, according to the last mentioned prior art method the phase and frequency detectors would detect the elongated zero pulse and generate erroneous control signals for causing the VCO to lower its frequency. Thus, the phase locked loop can lose lock, requiring that the inlock condition be established and that the data be retransmitted, resulting in low efficiency and high error rate.

SUMMARY OF THE INVENTION

According to the present invention, a phase locked loop is provided for synchronizing a local digital oscillator signal with a reference input signal, comprised of separate phase and frequency detectors and circuitry for eliminating generation of erroneous phase and frequency detector control signals resulting from elongated data bits due to bipolar violations, etc.

BRIEF DESCRIPTION OF THE DRAWINGS

A better understanding of the present invention will be obtained with reference to the detailed description below in conjunction with the following drawings, in which.

DESCRIPTION OF THE PREFERRED EMBODIMENTS

Figure 1:
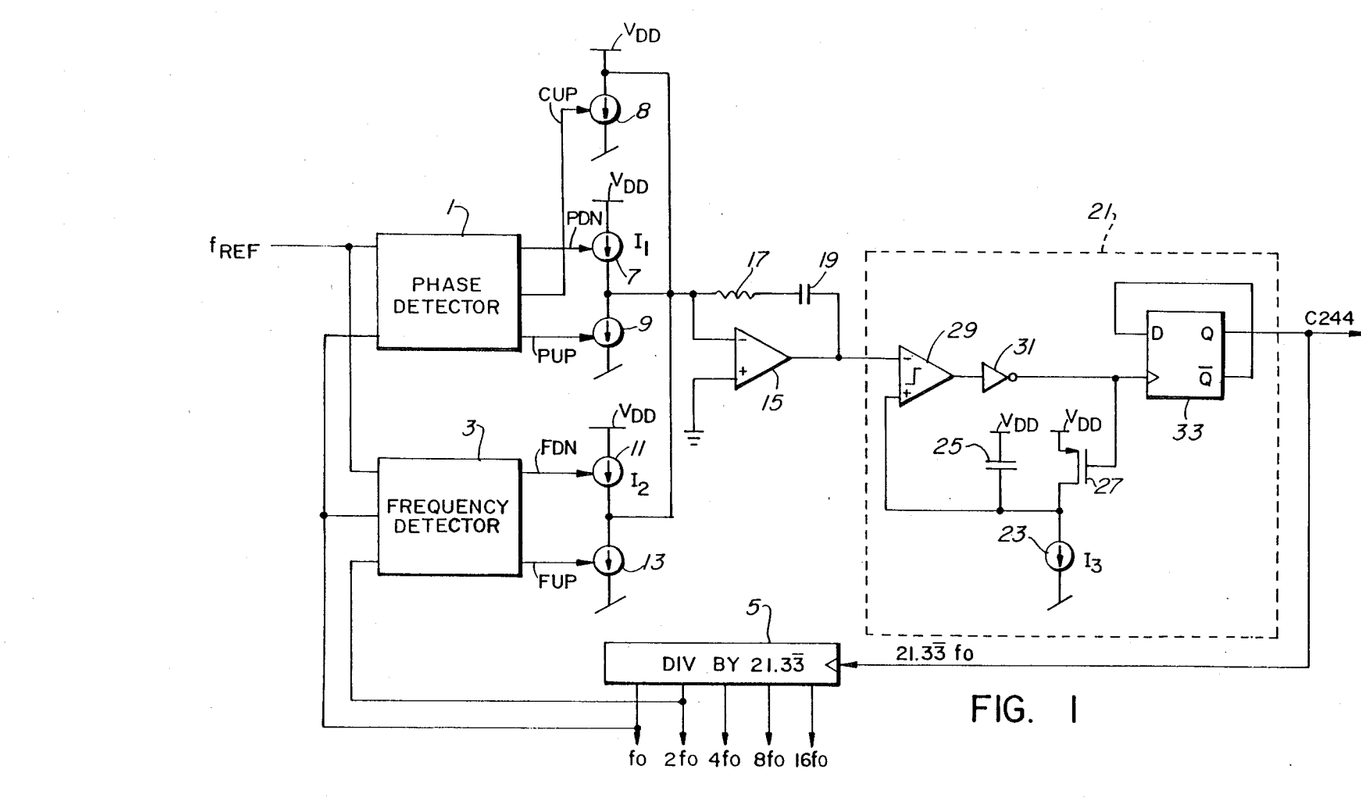
FIG. 1 is a block schematic diagram of a phase locked loop according to the present invention.

With reference to FIG. 1, an input signal $f_{REF}$ (e.g., a 192 kHz digital data signal) is received and simultaneously applied to first inputs of phase and frequency detectors 1 and 3 respectively. Second inputs of the phase and frequency detectors 1 and 3 are connected to the output of a divide by 21.33 counter 5 for receiving a local reference signal $f_o$, generated thereby. Counter 5 also generates multiples of the $f_o$ signal (i.e., $2f_o$, $4f_o$, $8f_o$, and $16f_o$). A third input of the frequency detector 3 is connected to counter 5 for receiving the $2f_o$ signal.

The phase and frequency detectors 1 and 3 receive and compare the phase and frequency respectively, of the reference signal $f_{REF}$ and local oscillator signal $f_o$ (and $2f_o$), and in response generate up and down frequency control pulses (PDN,CUP, PUP, FDN, FUP) for application to associated current sources 7, 8, 9, 11 and 13.

The control output pulse signals from phase detector 1 and frequency detector 3 are applied to current sources 7, 8, 9 and 11, 13 respectively. The current sources are all preferably switched current sources.

The nodes connecting pairs of current sources 7 and 9, 11 and 13, are connected together and to current source 8, and to the inverting input of a loop filter comprised of an operational amplifier 15, and a series combination of a resistor 17 and capacitor 19. The non-inverting input of operational amplifier 15 is connected to ground. The output of the loop filter is connected to a control voltage input of a voltage controlled oscillator 21, for generating a digital system clock signal C244. As discussed above, the C244 signal is applied to the divide by 21.33 counter 5 for generating the local oscillator signal of of approximately the same frequency as the reference signal $f_{REF}$.

Thus, in operation the up and down control pulses from phase and frequency detectors 1 and 3 are summed at the input of the loop filter, which in response generates a DC control voltage signal for controlling the frequency of the local clock signal C244 output from VCO 21. The clock signal C244, having a nominal frequency of 4.096 megahertz according to a successful prototype, is utilized by external circuitry of the local telephone set or terminal, for timing and synchronization. The C244 signal is then divided by counter 5 for producing the local oscillator signal $f_o$ which is frequency matched to the approximately 192 kHz input data signal, $f_{REF}$.

According to a successful prototype, the voltage control oscillator 21 was comprised of a constant current source 23, an integrating capacitor 25, an PMOS discharge transistor 27, and a comparator 29.

The signal output from comparator 29 is inverted via inverter 31, which is at a high level when the voltage at the integrating capacitor 25 is greater than the voltage at the non-inverting control input of comparator 29, and therefore the discharge transistor 27 remains off. The current source 23 provides a constant current which is integrated on the capacitor 25 until the capacitor voltage falls to equivalence with the input control voltage from the loop filter. The comparator 29 then switches on, the PMOS transistor 27 conducts, and the capacitor 25 is discharged to $V_{DD}$ potential, thereby resetting the comparator. The signal output from comparator 29 is inverted via inverter 31, and used to toggle a flip-flop 33, which in response generates the output clock signal C244.

The preferred design of VCO 21 allows for large adjustments of the output signal frequency in response to variations in the DC control voltage. With a comparator common mode range of from 2 to 3 volts (using a 5 volt power supply), VCO 21 exhibits a frequency range of from 0.7 to 2.0 times the frequency at the center of its common mode range.

The comparator 29 in VCO 21 is preferably characterized by low gain and high switching speed since high switching resolution is not typically necessary for clock signal extraction applications. According to the successful prototype, comparator 29 consisted of a single differential stage. The comparator delay or switching time is dependent upon temperature, MOS transistor threshold, and the common mode operating point. According to the successful prototype, preliminary simulations indicate that the worst case limits for the comparator delay are in the order of from 10 nanoseconds to 20 nanoseconds. With two delays per period, plus or minus 10 nanoseconds contributes approximately 8% to the overall tolerance of the VCO 21.

Figure 2A:
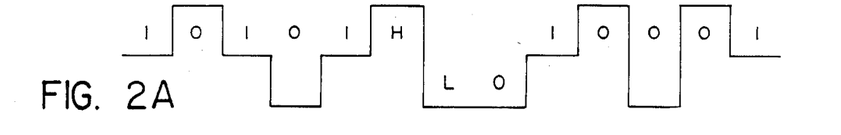
FIGS. 2A and 2B are timing diagrams illustrating the correspondence between ASI signal encoding and NRZ signal format, particularly with reference to the occurrence of a bipolar violation.

With reference to FIG. 2A, a typical ASI encoded data signal is illustrated wherein the start of a new frame of data is indicated by a framing pulse (H,L) followed by the data frame wherein the first zero bit has the same polarity as the low framing bit L. As discussed above, this is known in the art as a bipolar violation. The local digital telephone set or terminal converts the ASI encoded signal received from the telephone line, into an NRZ format as shown in FIG. 2B, wherein a zero bit is designated by a logic high signal, and a one bit is indicated by an absence of signal.

Conversion of ASI to NRZ format is performed in a well known manner by logically OR-ing positive and negative peaks of the ASI line signal, and detecting the logically OR-ed peaks via a comparator for generating the NRZ signal.

Consequently, in the event of a HL framing pulse, the transmission characteristics of the telephone line result typically in rounding of the pulses such that the pulses do not conform to a 100% duty cycle. Accordingly, the NRZ signal corresponding to the HL framing pulse is designated by two closely spaced logic high zero bits.

Figure 2B:
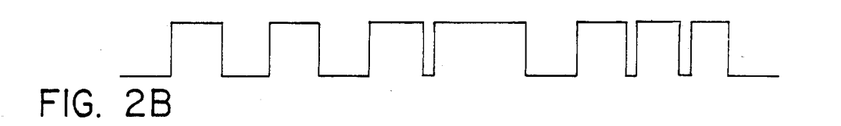

However, in the event of a bipolar violation in which the first zero bit of a frame of data following the framing pulse, occurs immediately after the framing pulse, the NRZ representation appears as an elongated logic high zero bit, as shown in FIG. 2B.

According to the prior art, the phase detector would detect the elongated logic high pulse and in response generate an erroneous elongated PDN control signal for approximately one and a half times the duration of a nominal control pulse, such that the frequency of the local oscillator signal $f_o$ is over-adjusted in VCO 21 and the phase locked loop loses lock.

As discussed in greater detail below with reference to FIGS. 3, 4A and 4B, the phase detector 1 and frequency detector 3 according to the present invention, include circuitry for detecting bipolar violations and generating correction control signals in response thereto, such that the phase locked loop does not lose lock.

Figure 3:
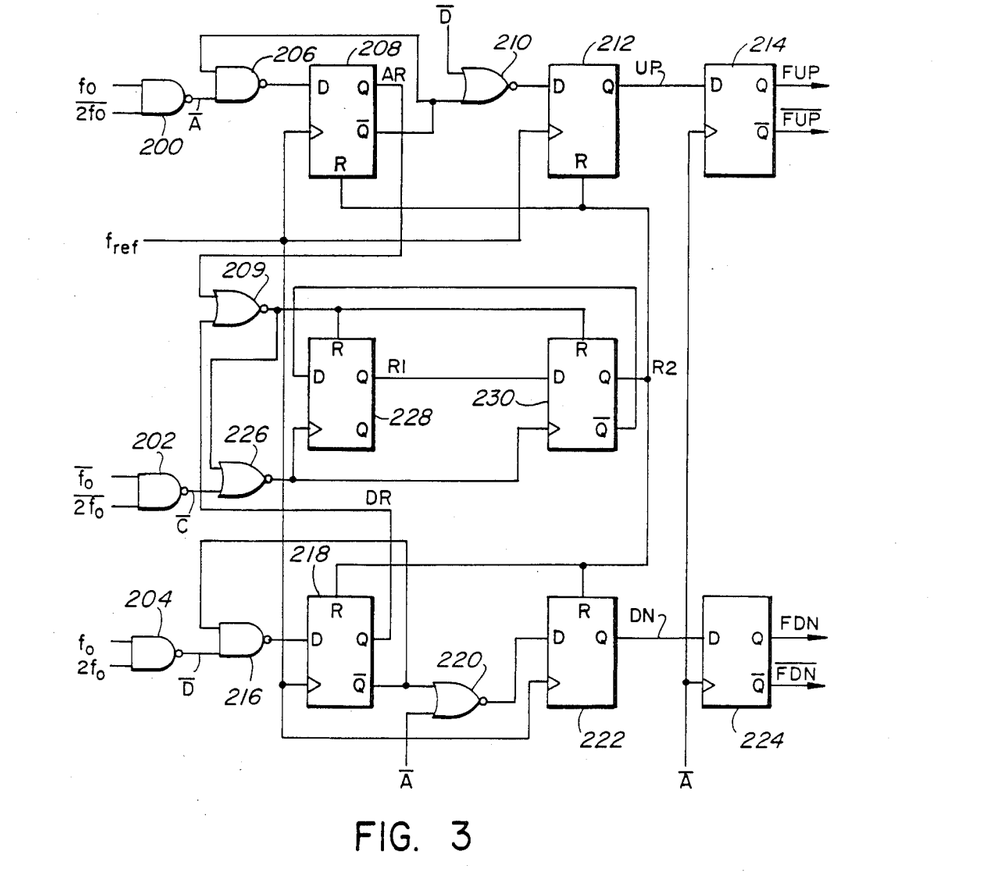
FIG. 3 is a schematic diagram of a frequency detector according to a preferred embodiment of the present invention.

With reference to FIG. 3, the frequency detector 3 is shown in greater detail, and is similar in design to the rotational frequency detector suggested by the aforementioned article of Messerschmitt. The frequency detector works on the principle that two digital signals, unmatched in frequency, will slip by each other in time. When $f_{REF}$ and $f_o$ are equal, the edges of the digital signals will maintain a fixed relationship. In the event the $f_o$ signal is of greater frequency than the $f_{REF}$ signal, the transitions or edges of the $f_{REF}$ signal will advance in phase relative to those of the $f_o$ signal, and vice versa when $f_{REF}$ is of greater frequency than $f_o$. The frequency detector 3 detects when the rising edge of one digital signal slips pass the edge of the other, and generates one of either a "FUP" or "FDN" pulse indicating the direction in which the slip has occurred.

When the frequencies are matched, the frequency detector 3 will generate FUP and FDN pulses for keeping the edges of the digital signals aligned. To disable the frequency detector 3, the phase detector 1 causes the rising edge of the divided VCO 21 clock signal (i.e., C244÷21.33=$f_o$) to be aligned with the center of the reference digital signal $f_{REF}$, as discussed in greater detail below with reference to FIGS. 4 and 5. With the edges of the digital signals separated from each other, the frequency detector 3 is never activated, and no output control signals are produced therefrom. Hence, the phase detector 1 and frequency detector 3 are prevented from operating simultaneously so as not to destabilize each other.

In operation, the $f_o$ and 2$f_o$ signals (and inverted versions thereof) are received from counter 5 and applied to NAND gates 200, 202 and 204 which in response produce intermediate pulses comprised of four quarter periods of a single cycle of the $f_o$ local oscillator signal.

Figure 4A:
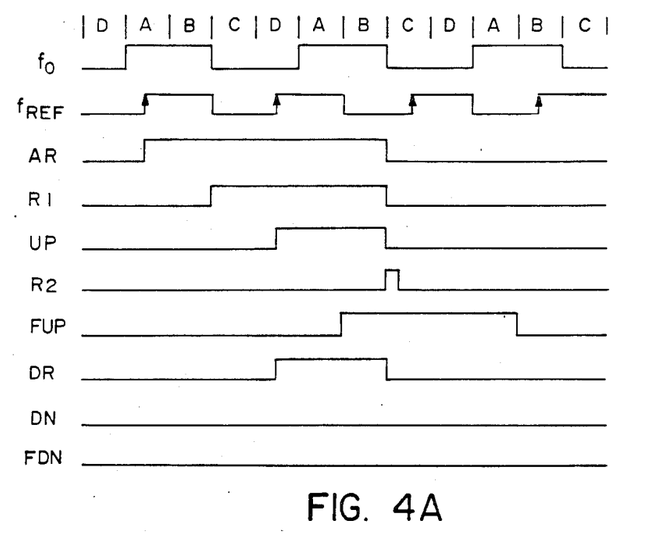
FIGS. 4A and 4B are timing diagrams for illustrating operation of the frequency detector shown in FIG. 3.
Figure 4B:
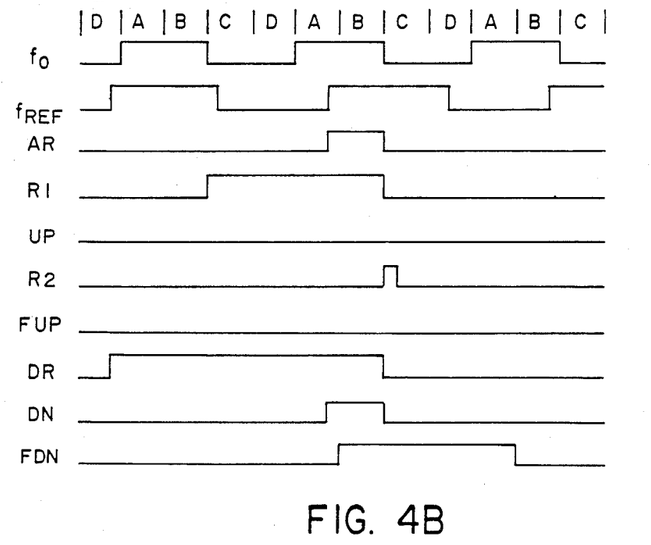

In particular, with reference to FIGS. 4A and 4B, the $f_o$ oscillator signal is separated into four quarter period signals A, B, C and D (or $\overline{A}$, $\overline{B}$, $\overline{C}$ and $\overline{D}$).

The $\overline{A}$ quarter period signal is applied to the first input of a NAND gate 206 having an output connected to the D input of a flip-flop 208. Flip-flop 208 is clocked via the $f_{REF}$ signal, and generates an output signal designated as AR from the Q output thereof, for application to a first input of NOR gate 209.

The $\overline{Q}$ output of flip-flop 208 is connected to the first input of a NOR gate 210 and to a second input of the NAND gate 206.

A second input of NOR gate 210 receives the $\overline{D}$ quarter period signal generated by NAND gate 204 and in response generates a data signal for application to the D input of a flip-flop 212. Flip-flop 212 is also clocked by the $f_{REF}$ signal and generates an UP control signal from the Q output thereof for application to the D input of a further flip-flop 214. Flip-flop 214 is clocked by the $\overline{A}$ signal generated by NAND gate 200 and in response produces the FUP and $\overline{FUP}$ control pulse signals on Q and $\overline{Q}$ outputs thereof.

The $\overline{D}$ signal from NAND gate 204 is applied to a first input of a NOR gate 216 having an output connected to the D input of a flip-flop 218 which is clocked from the remote $f_{REF}$ signal. The Q output of flip-flop 218 generates a signal designated DR for application to a second input of NOR gate 208. The $\overline{Q}$ output of flip-flop 218 is connected to a second input of NAND gate 216 and to a first input of a further NOR gate 220. A second input of NOR gate 220 is connected to the output of NAND gate 200 for receiving the $\overline{A}$ signal, and an output of NOR gate 220 is connected to the D input of a flip-flop 222, also clocked via the $f_{REF}$ signal. The Q output of flip-flop 222 generates a DN data signal for application to the D input of an additional flip-flop 224 which is clocked by the $\overline{A}$ signal. The Q and $\overline{Q}$ outputs of flip-flop 224 generate the FDN and $\overline{FDN}$ control pulse signals discussed above with reference to FIG. 1.

The output of NOR gate 209 is connected to the first input of a NOR gate 226, the second input of which is connected to the output of NAND gate 202 for receiving the $\overline{C}$ signal. An output of NAND gate 226 is connected to clock inputs of flip-flops 228 and 230. The output of NAND gate 208 is also connected to reset input R of flip-flops 228 and 230 and the Q otput of flip-flop 228 generates a signal R1 for application to the D input of flip-flop 230, and the $\overline{Q}$ output of flip-flop 230 is reconnected to the D input of flip-flop 228.

The Q output of flip-flop 230 generates a reset signal R2 for application to reset inputs of flip-flops 208, 212, 218 and 222.

The operation of the frequency detector illustrated in FIG. 3 can be better understood with reference to the timing diagrams of FIGS. 4A and 4B.

In particular, with reference to FIG. 4A, in the event of a rising edge of the $f_{REF}$ signal occurring in period A, followed by the next rising edge occurring in the subsequent period D, indicating that the local oscillator signal frequency $f_o$ is less than the remote signal frequency $f_{REF}$, an FUP pulse signal is generated. Similarly, if the rising edge of the $f_{REF}$ signal occurs in period D and is immediately followed by the next edge occurring in period A (approximately one cycle later), then a FDN pulse signal is generated.

Circuitry is included for ensuring that no more than one cycle of the $f_o$ signal occurs between A-D or D-A period pairs, to avoid erroneous control signals being generated in the event of elongated data pulses such as for example in the event of a bipolar violation wherein the first bit of a frame of data is a zero bit, as discussed above with reference to FIGS. 2A and 2B. In particular, flip-flops 228 and 230 function as a counter for ensuring no more than two transitions of the $\overline{C}$ signal have elapsed before the R2 signal is generated for resetting flip-flops 208, 212, 218 and 222. Thus erroneous output control signals are not generated by the frequency detector 3 in the event of missing transitions of the $f_{REF}$ signal, or in the event of bipolar violations, since the frequency detection range of the detector 3 is effectively limited to approximately twice the $f_o$ signal frequency, (i.e., the range is limited to from approximately $0.7 f_o$ to $2 f_o$).

Figure 5:
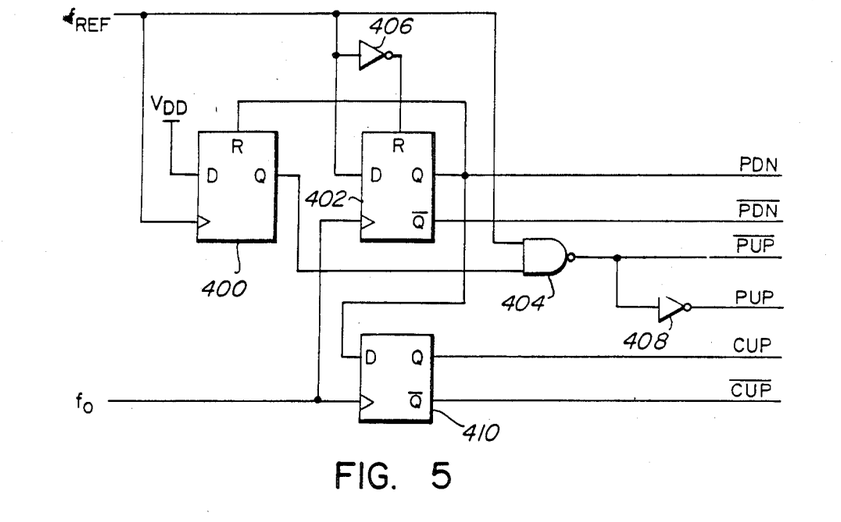
FIG. 5 is a schematic diagram of a phase detector according to the preferred embodiment of the present invention.

With reference to FIG. 5, the phase detector 1 is shown in greater detail.

The $f_{REF}$ signal is applied to a clock input of a flip-flop 400 as well as to the data input D of a flip-flop 402 and to the first input of a NAND gate 404. The D input of flip-flop 400 is connected to a logic high voltage source, and the Q output thereof is connected to the second input of NAND gate 404.

Flip-flop 402 generates the aforementioned PDN control pulse signal which is also applied as a reset pulse a reset signal on the Q to a reset input R of flip-flop 400. The $f_{REF}$ signal is applied to the reset input R of flip-flop 402 via an inverter 406.

The output of NAND gate 404 generates the aforementioned $\overline{PUP}$ control signal which is inverted via an inverter 408 for generating the PUP signal.

The control, signal PDN output from the Q terminal flip-flop 402 is applied to the D input of a further flip-flop 410 which is also clocked by the $f_o$ signal. Flip-flop 410 monitors the PDN control signal and generates a correction CUP and ($\overline{CUP}$) signal from the Q and ($\overline{Q}$) output thereof in the event of a PDN signal being generated for more than one cycle of the $f_o$ signal. This effectively corrects for erroneous control pulse signal generation in the event of bipolar violations, as discussed above with reference to FIGS. 2A and 2B.

The purpose of the phase detector 1 is to compare the input signal $f_o$ to the reference signal $f_{REF}$, and to produce a control pulse signal PDN or PUP having a pulse width which is proportional to the difference in phase between the two input signals. To facilitate bit sampling, the phase detector 1 has a built in phase offset to align the rising edge of the local oscillator signal $f_o$ with the center of the reference signal $f_{REF}$.

Figure 6:
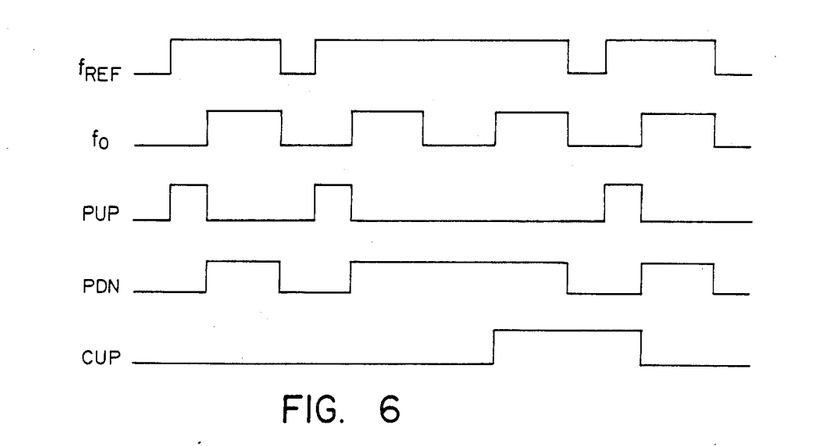
FIG. 6 is a timing diagram for illustrating operation of the phase detector shown in FIG. 5.

The phase detector 1 as shown in FIG. 5, functions to position the rising edge of the local oscillator signal $f_o$ in the center of the reference pulse $f_{REF}$ by integrating the area underneath the reference pulse $f_{REF}$ before and after the rising edge of the local clock signal $f_o$. This gives an average correction or control pulse signal that is proportional to the difference between the two areas, as shown in the timing diagram of FIG. 6.

When the local signal $f_o$ and the reference signal $f_{REF}$ are unmatched in frequency, the statistical time average of the phase detector output is zero, so that phase detector 1 makes no net contribution to the VCO 21 control voltage, allowing the frequency detector 3 to function independently. However, in the event the rising edge of the $f_o$ signal lags the center of the $f_{REF}$ signal, a PUP signal will be generated which has a wider pulse width than the PDN signal which follows it, causing the frequency of the $f_o$ signal to be slightly increased, thereby advancing the rising edge of the $f_o$ signal to the center of the $f_{REF}$ pulse. Conversely, in the event the $f_o$ signal rising edge leads the center of the $f_{REF}$ pulse, the PDN pulse width is elongated and the PUP pulse width is proportionately shortened, causing VCO 21 to generate a slightly lower frequency $f_o$ signal which in response causes the rising edge thereof to be realigned with the center of the $f_{REF}$ pulse.

The overall transfer function in the frequency domain of the phase locked loop of FIG. 1, is given by:

$$H(s) = \frac{K_o K_d F(s)/N}{s + K_o K_d F(s)/N},$$

where
$K_o$ = gain of VCO 21,
$K_d$ = gain of phase detector 1,
$F(s)$ = loop filter transfer function,
$N$ = constant of division due to counter 5.
The error transfer function is given by $$H_e(s) = \frac{s}{s + K_o K_d F(s)/N},$$

With an active filter implementation using operational amplifier 15, the transfer function becomes, $$H(s) = \frac{K_o K_d (sT_2 + 1)/NT_1}{s^2 + sK_o K_d T_2/NT_1 + K_o K_d/NT_1},$$

where
$T_1$ = time constant due to the resistance of the current sources 7, 9, 11 and 13 in combination with capacitor 19,
$T_2$ = time constant due to resistor 17 and capacitor 19,
The natural frequency $W_n$ is given by $$W_n = \sqrt{\frac{K_o K_d}{NT_1}}$$

and the damping factor Z is $$Z = \frac{T_2}{2} \sqrt{\frac{K_o K_d}{NT_1}}$$

The transfer function can then be written as $$H(s) = \frac{2sZW_n + W_n^2}{s^2 + 2ZW_n s + W_n^2}$$

Hence, the phase locked loop with active filter as described herein functions as a second order low pass filter for an input phase signal whose frequency spectrum lies between zero and the natural frequency $W_n$ (i.e., the loop is able to track phase and frequency modulations as long as they remain within an angular frequency band approximately between zero and $W_n$).

The damping factor Z determines the flatness of the response over this frequency band. It has been found that an optimally flat response can be obtained for a value of $Z = 1/\sqrt{2}$. For $Z = 1$, the system is critically damped.

An important parameter for characterizing the performance of a phase locked loop is the lock range delta $W_1$. This is the frequency range in which the loop will lock within one single beat note of the reference and output frequencies.

Normally, phase locked loop operation is held to within this frequency range. The lock range and lock time are defined as delta $W_1 = 2\, Pi\, Z\, W_n$ $T_1 1/W_n$ Thus, it can be seen that a design with a large $W_n$ will give both a quick pull in time and a large lock range.

In summary, according to the present invention is provided for synchronizing a local digital oscillator signal with a remote ASI encoded data signal. Parallel phase and frequency detectors are used for enabling quick and accurate locking of both frequency and phase of the remote and local signals. Also, circuitry is included for detecting and correcting generation of erroneous frequency control pulse signals by the phase and frequency detectors in the event of a bipolar violation wherein the first data bit of a frame is a zero bit.

A person understanding the present invention may conceive of other embodiments or variations therein. For example, the phase locked loop can be used to frequency align a local oscillator signal with an AMI or other type of encoded data signal, suitable modification being made to the logic circuitry of the phase and frequency detectors for detecting and correcting erroneous control pulse signal generation in the event of bipolar violations.

All such modifications and variations are believed to be within the sphere and scope of the present invention as defined by the claims appended hereto.

We claim:

1. A phase locked loop for synchronizing a local digital signal with a remote digital signal, comprised of:
    (a) first means for receiving and comparing said local and remote digital signals, and upwardly adjusting the frequency of said local signal in the event the local signal frequency is less than the remote signal frequency, and downwardly adjusting the frequency of said local signal in the event the local signal frequency is greater than the remote signal frequency,
    (b) second means for receiving and comparing said local and remote signals, and upwardly adjusting the frequency of said local signal in the event the local signal phase lags the remote signal phase, and downwardly adjusting the frequency of said local signal in the event the local signal phase leads the remote signal phase, and
    (c) means for detecting elongated pulse widths of said remote digital signal and upwardly adjusting the frequency of said local signal in response thereto, for counteracting downward adjustment of the local signal frequency by said first and second means in response to detection of said elongated remote signal pulse widths,
    whereby said local and remote signals are phase and frequency locked regardless of pulse width anomalies of said remote signal.

2. A phase locked loop as defined in claim 1, further including a voltage controlled oscillator for generating a high frequency oscillator output signal from which said local digital signal is 3. A phase locked loop as defined in claim 2, wherein said first and second means are comprised of a frequency detector and phase detector respectively, for generating up and down control voltage signals for application to said voltage controlled oscillator in order to adjust the frequency of said local digital signal.

4. A phase locked loop as defined in claim 3, wherein said means for detecting elongated pulse widths is comprised of logic circuitry for generating an up control voltage signal in the event one or both of said phase and frequency detectors generate down control voltage signals for more than one cycle of said local signal.

5. A phase locked loop as defined in claim 4, further including a loop filter for summing and integrating said control voltage signals and generating a DC control signal for application to a control voltage input of said voltage controlled oscillator in response thereto.

6. A phase locked loop as defined in claim 4, wherein said voltage controlled oscillator is further comprised of a digital signal divider for receiving and frequency dividing said high frequency oscillator output signal and generating said local signal in response thereto.

7. A phase locked loop as defined in claim 3, further including a loop filter for summing and integrating said control voltage signals and generating a DC control signal for application to a control voltage input of said voltage controlled oscillator in response thereto.

8. A phase locked loop as defined in claim 7, wherein said loop filter is comprised of an operational amplifier, and a resistor and capacitor connected in series to an inverting input of said amplifier and an output thereof, a non-inverting input thereof being connected to ground.

9. A phase locked loop as defined in claim 8, wherein said up and down control voltage signals are applied to the inverting input of said operational amplifier via respective current source circuits.

10. A phase locked loop as defined in claim 9, wherein said current source circuits generate current signals having magnitudes characterized by a predetermined current reference.

11. A phase locked loop as defined in claim 3, wherein said means for detecting is comprised of logic circuitry for upwardly adjusting one or both of said up and down control voltage signals in the event a corresponding one or both of said control voltage signals were previously downwardly adjusted for more than one cycle of said local digital signal, as a result of a bipolar violation followed by a zero bit.

12. A phase locked loop as defined in claim 2, wherein said voltage controlled oscillator is further comprised of a digital signal divider for receiving and frequency dividing said high frequency oscillator output signal and generating said local signal in response thereto.

13. A phase locked loop as defined in claim 12, wherein said high frequency signal has a frequency of approximately 4.096 megahertz, and said divider divides the 4.096 megahertz high frequency signal by 21.3$\overline{3}$ and generates said local oscillator signal at 192 kHz in response thereto.

14. A phase locked loop as defined in claim 3, wherein said voltage controlled oscillator is further comprised of a digital signal divider for receiving and frequency dividing said high frequency oscillator output signal and generating said local signal in response thereto.

* * * * *